(12) United States Patent
Ebuchi et al.

(10) Patent No.: US 9,356,589 B2
(45) Date of Patent: May 31, 2016

(54) INTERCHANNEL SKEW ADJUSTMENT CIRCUIT

(71) Applicant: PANASONIC CORPORATION, Osaka (JP)

(72) Inventors: Tsuyoshi Ebuchi, Osaka (JP); Toru Iwata, Osaka (JP); Yoshihide Komatsu, Osaka (JP); Yuji Yamada, Osaka (JP); Shinya Miyazaki, Osaka (JP); Tsuyoshi Hiraki, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 254 days.

(21) Appl. No.: 14/056,865

(22) Filed: Oct. 17, 2013

(65) Prior Publication Data

US 2014/0043079 A1 Feb. 13, 2014

Related U.S. Application Data

(63) Continuation of application No. PCT/JP2012/001461, filed on Mar. 2, 2012.

(30) Foreign Application Priority Data

Apr. 25, 2011 (JP) ................................. 2011-097216

(51) Int. Cl.
*G06F 1/04* (2006.01)
*G06F 1/12* (2006.01)
(Continued)

(52) U.S. Cl.
CPC *H03K 5/159* (2013.01); *G06F 1/12* (2013.01); *G06F 13/4282* (2013.01);
(Continued)

(58) Field of Classification Search
CPC ........ G06F 1/12; H04L 7/0033; H04L 7/0041
USPC ........................... 713/400, 401, 503; 375/371
See application file for complete search history.

(56) References Cited

U.S. PATENT DOCUMENTS 6,175,928 B1 * 1/2001 Liu ........................... G06F 1/04
713/401
6,336,192 B1 * 1/2002 Sakamoto ............... H04L 25/14
713/503

(Continued)

FOREIGN PATENT DOCUMENTS

JP 05-110550 A 4/1993
JP 11-341102 A 12/1999
JP 2002-189698 A 7/2002

OTHER PUBLICATIONS

International Search Report issued in International Application No. PCT/JP2012/001461 with Date of mailing Jun. 5, 2012.

(Continued)

*Primary Examiner* — Ji H Bae
(74) *Attorney, Agent, or Firm* — McDermott Will & Emery LLP

(57) ABSTRACT

An interchannel skew adjustment circuit adjusts signal skew between a first channel and a second channel. The circuit includes a phase adjustment circuit configured to receive a signal of the first channel, delay the signal by a discretely variable delay amount, and output a delayed signal; a channel coupling circuit configured to receive the signal output from the phase adjustment circuit and a signal of the second channel, and detect a phase difference between these two signals; and a controller configured to control the delay amount in the phase adjustment circuit based on a result detected by the channel coupling circuit. This interchannel skew adjustment circuit adjusts the interchannel signal skew only at a sender or a receiver, thereby reducing the circuit area and the power consumption.

14 Claims, 13 Drawing Sheets

(51) Int. Cl.
*H04L 7/00* (2006.01)
*H03K 5/159* (2006.01)
*G06F 13/42* (2006.01)
*G09G 5/00* (2006.01)

(52) U.S. Cl.
CPC ............. *G09G 5/006* (2013.01); *H04L 7/0033* (2013.01); *H04L 7/0041* (2013.01); *G09G 5/008* (2013.01); *G09G 2370/14* (2013.01); *Y02B 60/1228* (2013.01); *Y02B 60/1235* (2013.01)

(56) References Cited

U.S. PATENT DOCUMENTS

| | | | |
|---|---|---|---|
| 6,654,897 | B1 | 11/2003 | Dreps et al. |
| 6,874,097 | B1 * | 3/2005 | Aliahmad ................. G06F 1/10 375/355 |
| 7,012,956 | B1 * | 3/2006 | Thomsen ................ G11C 29/02 375/224 |
| 7,031,420 | B1 * | 4/2006 | Jenkins ..................... G06F 1/10 327/149 |
| 7,999,591 | B2 * | 8/2011 | Kim ........................... G06F 1/10 327/269 |
| 2002/0006177 | A1 * | 1/2002 | Pickering ............ G06F 13/4269 375/371 |
| 2002/0009169 | A1 * | 1/2002 | Watanabe ............... H04L 25/14 375/371 |
| 2002/0075032 | A1 | 6/2002 | Kojima |
| 2009/0141843 | A1 * | 6/2009 | Bruennert ............. H04L 1/0047 375/371 |

OTHER PUBLICATIONS

Yuxiang Zheng et al., "A 5Gb/s Automatic sub-Bit Between-Pair Skew Compensator for Parallel Dta Communications in 0.13 μm CMOS," 2010 Symposium on VLSI Circuits/Technical Digest of Technical Papers, pp. 71-72.

* cited by examiner

INTERCHANNEL SKEW ADJUSTMENT CIRCUIT

CROSS-REFERENCE TO RELATED APPLICATIONS

This is a continuation of International Application No. PCT/JP2012/001461 filed on Mar. 2, 2012, which claims priority to Japanese Patent Application No. 2011-097216 filed on Apr. 25, 2011. The entire disclosures of these applications are incorporated by reference herein.

BACKGROUND

The present disclosure relates to circuits adjusting interchannel signal skew, and more particularly to interchannel skew adjustment circuits suitable for parallel transmission interfaces such as low voltage differential signaling (LVDS) interfaces.

LVDS interfaces are widely used as interfaces for data transmission among image processing LSIs inside digital televisions, and between image processing LSIs and display drivers. In recent years, the amount of information transmission of digital televisions has increased to accept 3D, 4K2K, and 8K4K, and an increase in the speed and bandwidths of LVDS interfaces have been required.

An LVDS interface transmits a clock signal (e.g., a single clock signal of 135 MHz) and a plurality of data signals (e.g., 20 data signals of 945 Mbps) at the same time, and belongs to interfaces for clock forward (i.e., source synchronous) parallel transmission. This type of interface may be an extremely simple circuit, which latches the plurality of data signals using the sent clock signal. However, the interface is generally regarded as not suitable for increasing speed, since interchannel skew between a clock and data, and between data and data becomes a bottleneck.

One solution to this problem of the interchannel skew is a clock embedded interface which sends data signals only and not a clock signal. This type of interface extracts the clock signal from the data signal in each channel, and thus the problem of the interchannel skew does not occur. However, a clock recovery circuit needs to be mounted in each channel at a receiver. This increases the complexity, the area, the cost, and the power consumption of the circuits at the receiver. In particular, receiver chips such as display drivers are placed at the panel and thus need to have a high breakdown voltage. Thus, a normal miniaturized process cannot be used, thereby increasing the area.

To address the problem, not a clock embedded interface but a source synchronous interface is used. In addition, to solve the problem of the interchannel skew, an interface receives and latches signals of channels sent from a sender circuit at a receiver circuit, feeds back the result to the sender circuit, and adjusts delay of the signals at the sender to correctly latch the signals at the receiver, is suggested. (See, for example, D1: Japanese Patent Publication No. 2002-189698.) Another interface adjusts interchannel skew by controlling the delay amount of a data delay circuit based on a frame signal contained in each signal of channels before delay adjustment. (See, for example, D2: Japanese Patent Publication No. H11-341102.) Yet another interface includes an analog phase detection circuit between channels of a receiver circuit, and adjusts the delay amount of an analog delay line to eliminate an interchannel phase difference. (See, for example, D3: Yuxiang Zheng, et al., A 5 Gb/s Automatic Sub-Bit Between-Pair Skew Compensator for Parallel Data Communications in 0.13 um CMOS, Digest of Symposium on VLSI Circuits, pp 71-72, June, 2010.)

The following requirements are placed on an interchannel skew adjustment circuit used for a source synchronous parallel transmission interface represented by an LVDS interface.

(1) Signals are transmitted in one direction only from a sender to a receiver. There is no signal fed back from the receiver to the sender, and thus a sender end or a receiver end needs to meet the specification of interchannel skew. This requires a mechanism automatically adjusting skew at the sender or the receiver.

(2) Since the number of channels is large, skew needs to be adjusted in a small area and at low power consumption. Therefore, skew is preferably adjusted using not an analog delay line but a digital circuit.

(3) Skew needs to be finely adjusted in each channel so that a person in charge of arranging a set of a television device, etc., performs optimum settings including sending and receiving. This requires a mechanism less influenced by process, voltage, and temperature (PVT) variations and generating constant delay.

The skew adjustment circuit shown in D1 requires a signal fed back from the receiver, and skew cannot be adjusted at the sender only. On the other hand, the skew adjustment circuit shown in D3 adjusts skew by at the receiver only. However, since an analog delay line is used, a large circuit area and high power consumption are concerned. The skew adjustment circuit shown in D2 feeds forward the frame signal to control the delay amount of each channel. Where the data delay circuit has characteristic variations, the output timing of the signals of the channels after the delay adjustment may be off. In addition, in each of the above-described conventional art, if the delay circuit has PVT variations, constant delay is difficult to generate, thereby degrading the accuracy of the skew adjustment.

Therefore, there is a need for an interchannel skew adjustment circuit, which adjusts interchannel signal skew using a sender or a receiver only in a small circuit area and at low power consumption. Furthermore, there is a need for a highly accurate interchannel skew adjustment circuit, which is less influenced by PVT variations.

SUMMARY

An interchannel skew adjustment circuit according to one aspect of the present disclosure adjusts signal skew between a first channel and a second channel. The circuit includes a phase adjustment circuit configured to receive a signal of the first channel, delay the signal by a discretely variable delay amount, and output a delayed signal; a channel coupling circuit configured to receive the signal output from the phase adjustment circuit and a signal of the second channel, and detect a phase difference between these two signals; and a controller configured to control the delay amount in the phase adjustment circuit based on a result detected by the channel coupling circuit.

In this aspect, the delay amount in the phase adjustment circuit is discretely variable, and the phase adjustment circuit can be a digital circuit, thereby reducing the circuit area and the power consumption of the interchannel skew adjustment circuit as a whole. Also, the delay amount in the phase adjustment circuit is controlled based on the phase difference between the signals of the first and second channels, which are delayed and output. As a result, the delay amount is controlled in view of the characteristic variations of the phase adjustment circuit without requiring feedback signals of the signals of the first and second channels.

The interchannel skew adjustment circuit further includes a PVT variation detection circuit configured to detect PVT variations of the phase adjustment circuit, and output PVT information indicating the PVT variations; and a PVT variation compensation circuit configured to compensate a control value output from the controller to the phase adjustment circuit based on the PVT information to control the delay amount in the phase adjustment circuit.

With this configuration, since the PVT variations in the phase adjustment circuit are compensated, the phase adjustment circuit generates constant delay without depending on the PVT variations.

DETAILED DESCRIPTION

Embodiments of the present disclosure will be described hereinafter with reference to the drawings.

Figure 1:
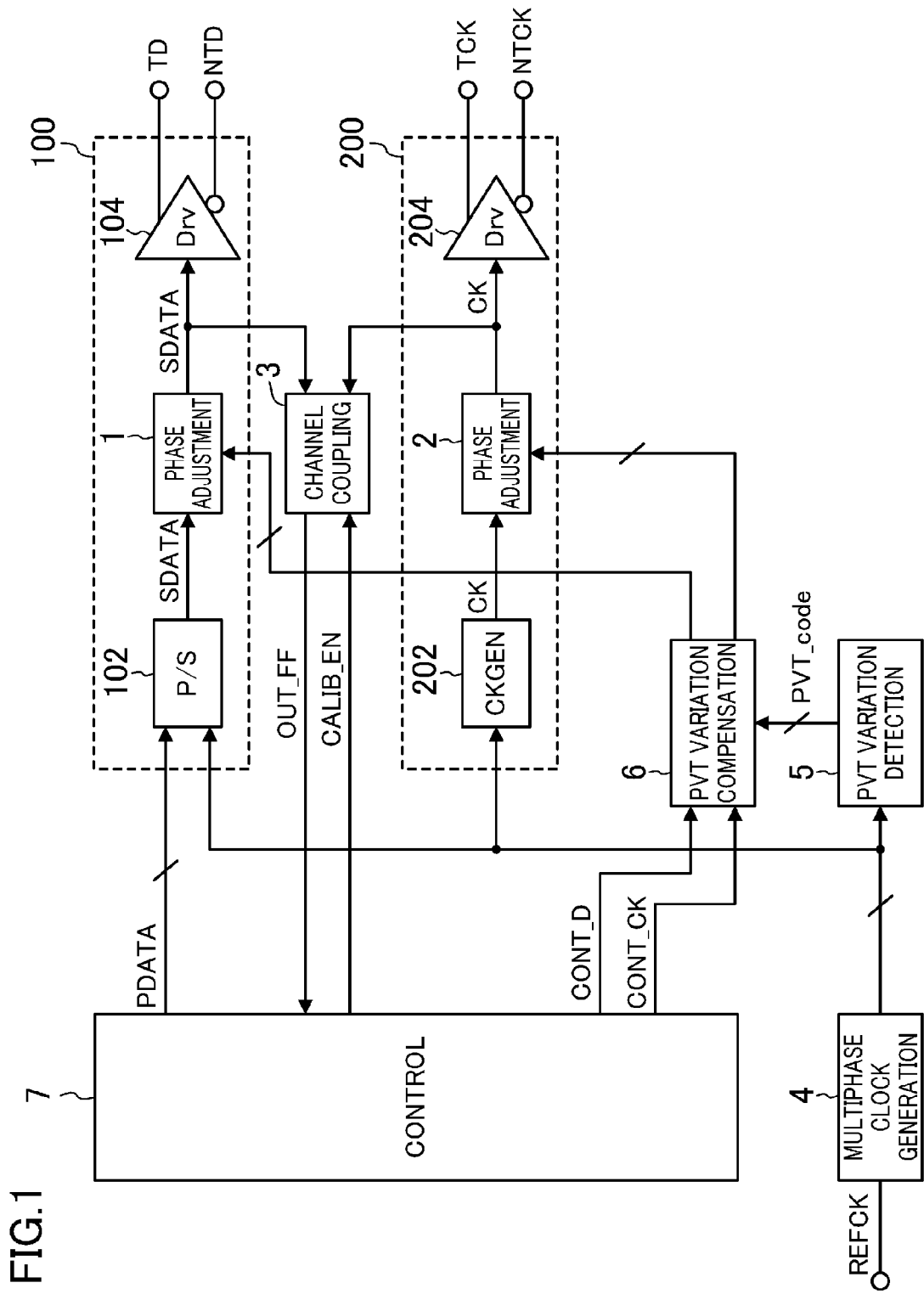
FIG. 1 illustrates the configuration of a sender mounting an interchannel skew adjustment circuit according to an embodiment of the present disclosure.

FIG. 1 illustrates an example of mounting an interchannel skew adjustment circuit according to an embodiment of the present disclosure in a sender. The interchannel skew adjustment circuit includes phase adjustment circuits 1 and 2, a channel coupling circuit 3, a multiphase clock generation circuit 4, a PVT variation detection circuit 5, a PVT variation compensation circuit 6, and a controller 7. The sender includes the interchannel skew adjustment circuit, a data transmitter 100 (i.e., a first channel), which converts an input parallel data signal to a serial data signal, and sends an LVDS data signal containing a signal TD and its inverted signal NTD, and a clock transmitter 200 (i.e., a second channel), which generates a clock signal, and sends a differential clock signal containing a signal TCK and its inverted signal NTCK. For convenience, an example will be described where the data transmitter 100 performs parallel to serial conversion at the ratio of 7:1 and sends an LVDS data signal of 945 Mbps, and the clock transmitter 200 sends a differential clock signal of 135 MHz.

The multiphase clock generation circuit 4 receives a reference clock signal REFCK, and outputs multiphase clock signals. Specifically, the multiphase clock generation circuit 4 generates clock signals PH1-PH14, which are obtained by dividing one period of a clock signal of 135 MHz by 14 phases. Although not particularly shown, the multiphase clock generation circuit 4 may be a phase locked loop (PLL) circuit or a delay locked loop (DLL) circuit, which includes a phase comparator, a charge pump circuit, a loop filter circuit, and a multiphase voltage controlled oscillator (VCO) circuit. Alternatively, no multiphase clock generation circuit 4 is provided and multiphase clock signals may be received from the outside.

The data transmitter 100 includes a parallel-to-serial conversion circuit 102, and a driver circuit 104. The parallel-to-serial conversion circuit 102 performs parallel to serial conversion of an input parallel data signal PDATA using PH2, PH4, PH6, PH8, PH10, PH12 and PH14 output from the multiphase clock generation circuit 4, and outputs a serial data signal SDATA. The driver circuit 104 is a current mode driver which receives SDATA delayed by the phase adjustment circuit 1, and outputs the LVDS data signal. A terminating resistor (not shown) is interposed between TD and NTD. A current is supplied from the driver circuit 104 to the terminating resistor, thereby generating amplitude. For example, the terminating resistor has a resistance of 100 Ω, the current supplied from the driver circuit 104 is 3.5 mA, and amplitude of 350 mV is generated.

The clock transmitter 200 includes a clock generation circuit 202, and a driver circuit 204. The clock generation circuit 202 generates a clock signal CK with a frequency of 1/7 the data rate using PH2 and PH10 output from the multiphase clock generation circuit 4. The driver circuit 204 is a current mode driver which receives the CK delayed by the phase adjustment circuit 2, and outputs the differential clock signal. The configuration of the driver circuit 204 is equivalent to the configuration of the driver circuit 104.

Each of the phase adjustment circuits 1 and 2 delay an input signal by a delay amount according to a given control value, and outputs the delayed signal. The phase adjustment circuits 1 and 2 discretely change the delay amount in accordance with the control value, and finely (e.g., each 10 ps) shifts the phase of the output signal.

Figure 2:
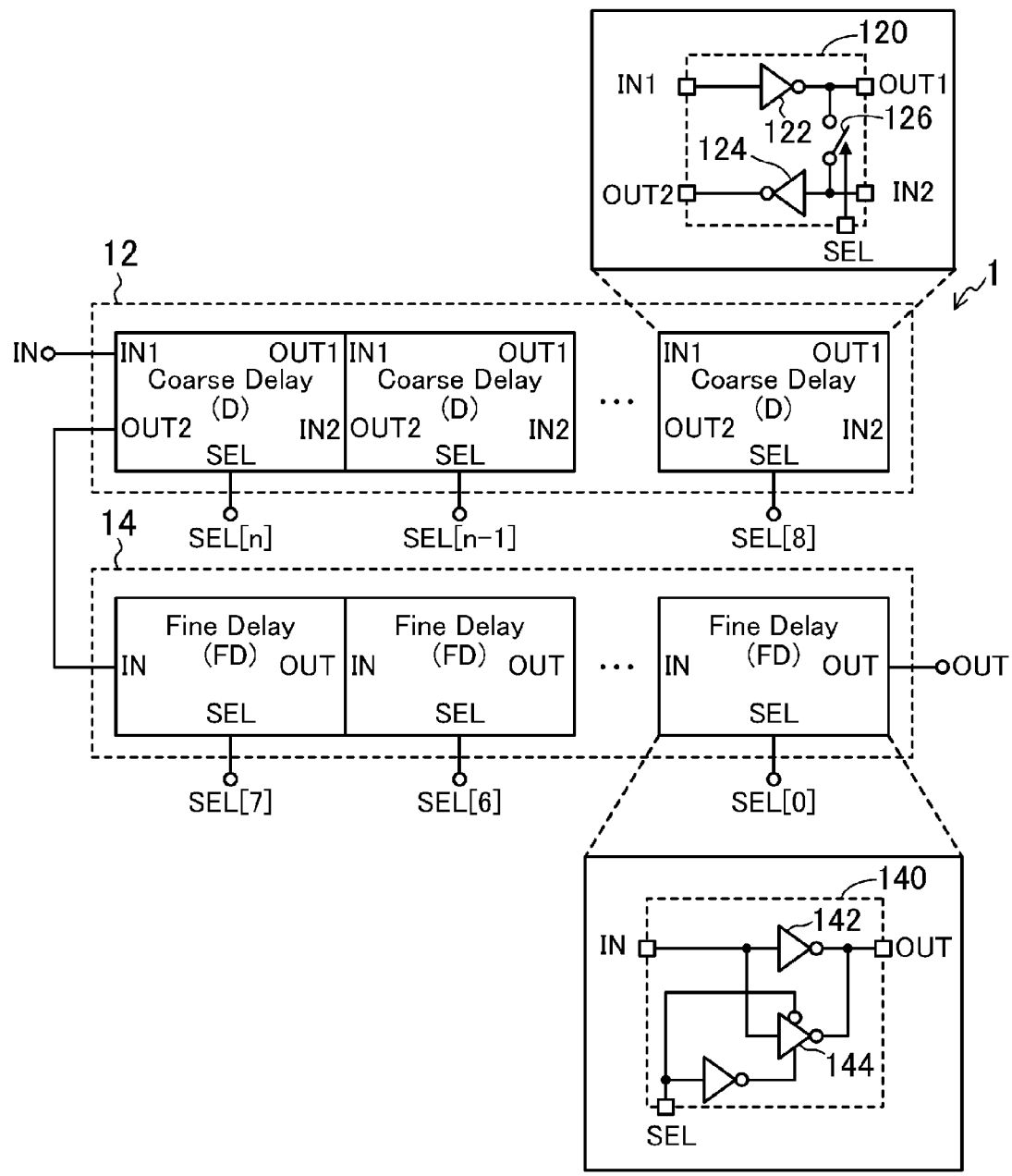
FIG. 2 illustrates the configuration of an example phase adjustment circuit.

FIG. 2 illustrates an example configuration of the phase adjustment circuit 1. The phase adjustment circuit 1 according to this example includes a coarse adjuster 12, which changes the delay amount in big steps, and a fine adjuster 14, which changes the delay amount in small steps. Control signals SEL[n:0] discretely change the delay amount.

The coarse adjuster 12 includes a plurality of delay circuits 120. Each delay circuit 120 includes an inverter circuit 122 having an input terminal IN1 and an output terminal OUT1, an inverter circuit 124 having an input terminal IN2 and an output terminal OUT2, and a switch 126. The switch 126 is interposed between the output terminal OUT1 and the input terminal IN2, and performs switching operation in response to a given control signal. Between an adjacent pair of the delay circuits 120, the output terminal OUT1 of one circuit 120 is coupled to the input terminal IN1 of the other circuit 120, and the input terminal IN2 of the one circuit 120 is coupled to the output terminal OUT2 of the other circuit 120.

Each of bits of SEL[n:8] is supplied to each of the delay circuits 120 as a control signal. SEL[n] is supplied to the delay circuit 120 at the first stage, and SEL[8] is supplied to the delay circuit 120 at the last stage. Thus, the delay amount in the coarse adjuster 12 is the minimum delay amount, which corresponds to the delay amount for a single delay circuit 120, when SEL[n] is set to a logic level of closing the switch 126, and the maximum delay amount (the delay amount for n−7 delay circuits 120 in this example), when SEL[8] is set to the logic level. The delay amount for a single delay circuit 120 corresponds to the sum of the delay amount in the inverter circuit 122 and the delay amount in the inverter circuit 124.

The fine adjuster 14 includes a plurality of delay circuits 140, and further delays the output signal of the coarse adjuster 12. Each delay circuit 140 includes an inverter circuit 142 having an input terminal IN and an output terminal OUT, and an inverter circuit 144 coupled in parallel to the inverter circuit 142. The inverter circuit 144 is switchable between active and inactive states in accordance with a given control signal. When the inverter circuit 144 is active, the driving power of the delay circuit 140 increases, and the delay amount decreases. On the other hand, when the inverter circuit 144 is inactive, the driving power of the delay circuit 140 decreases, and the delay amount increases.

Each of bits of SEL[7:0] is supplied to each of the delay circuits 140 as a control signal. SEL[7] is supplied to the delay circuit 140 at the first stage, and SEL[0] is supplied to the delay circuit 140 at the last stage. For example, the delay amount of the fine adjuster 14 is the minimum delay amount when all bits of SEL[7:0] are set to the logic level of activating the inverter circuit 144, and the maximum delay amount when all bits of SEL[7:0] are set to the logic level of deactivating the inverter circuit 144.

Figure 3:
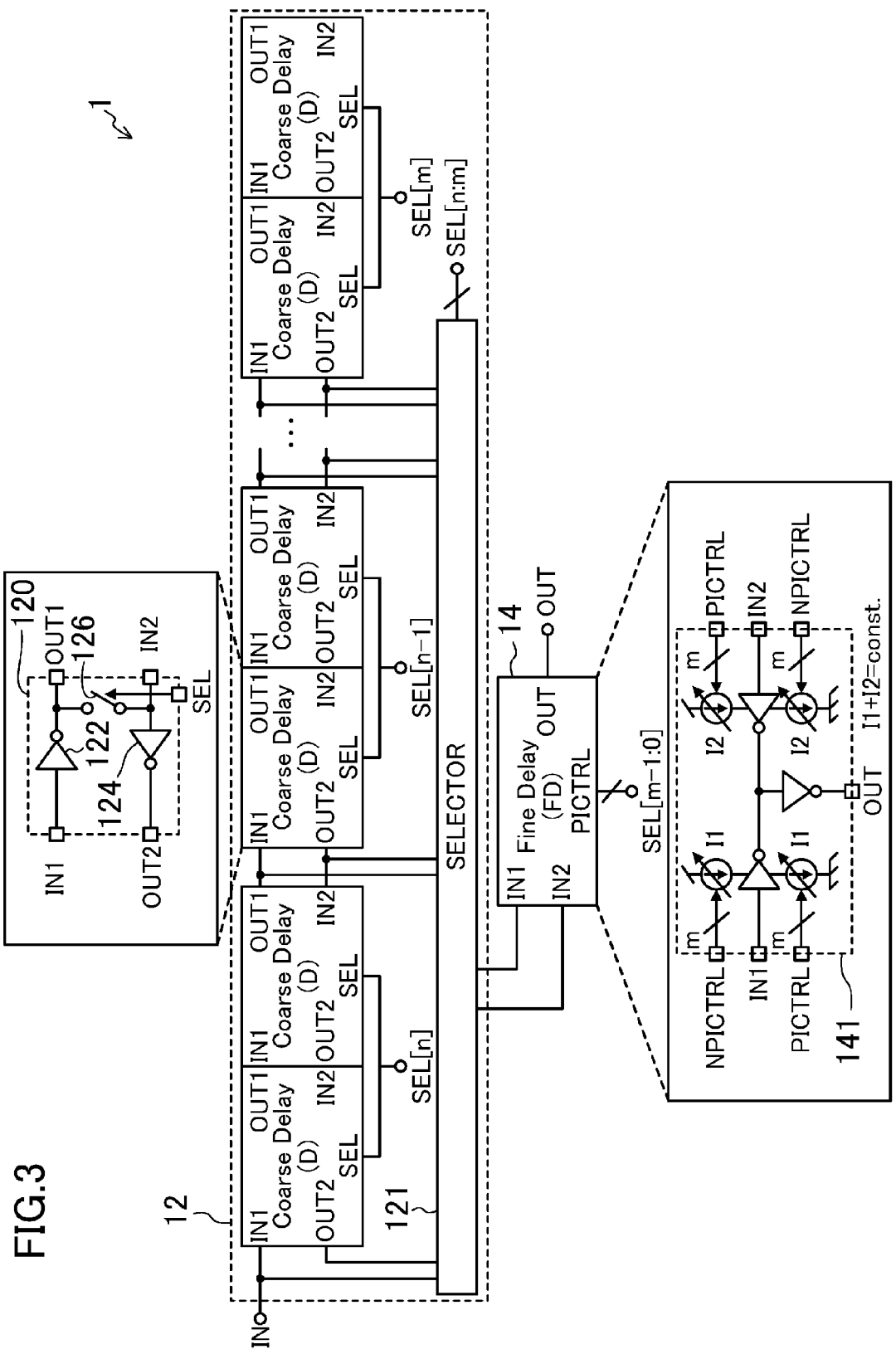
FIG. 3 illustrates the configuration of another example phase adjustment circuit.

FIG. 3 illustrates another example configuration of the phase adjustment circuit 1. The phase adjustment circuit 1 according to this example also includes a coarse adjuster 12, which changes the delay amount in big steps, and a fine adjuster 14, which changes the delay amount in small steps. Control signals SEL[n:0] discretely change the delay amount.

The coarse adjuster 12 includes a plurality of delay circuits 120 and a selector 121. Each delay circuit 120 has the above-described configuration. A common control signal is supplied to the adjacent pair of the delay circuits 120. The two delay circuits 120 are used as a circuit pair.

Each of bits of SEL[n:m] is supplied to each of the circuit pair as a control signal. SEL[n] is supplied to the circuit pair at the first stage, and SEL[m] supplied to the circuit pair at the last stage. The selector 121 receives a signal pair of a signal input to the input terminal IN1 of each circuit pair, and a signal output from the output terminal OUT2, and outputs one of the signal pair in accordance with given SEL[n:m]. For example, the delay amount of the coarse adjuster 12 is the minimum delay amount, which corresponds to the delay amount for a single delay circuit 120, when SEL[n] is set to the logic level of closing the switch 126, and the maximum delay amount (the delay amount for n−m+1 delay circuits 120 in this example), when SEL[m] is set to the logic level. The fine adjuster 14 includes a phase interpolator circuit 141. The signals of the pair output from the selector 121 are input to input terminals IN1 and IN2 of the phase interpolator circuit 141. There is always a phase difference corresponding to the delay amount for a single delay circuit 120 between the signal input to the input terminal IN1, and the signal input to the input terminal IN2. The phase interpolator circuit 141 interpolates the phase difference, and generates a finer phase difference. For example, where the phase interpolator circuit 141 is controlled with SEL[m−1:0], the phase difference between the signal pair output from the coarse adjuster 12 is divided into $2^m$ gradations, one of the signals having the phase differences is output from the output terminal OUT. With use of the phase interpolator circuit 141, the number of signal pass stages decreases as compared to the fine adjuster 14, which is an inverter chain shown in FIG. 2, and finer delay is generated.

In each of FIGS. 2 and 3, the coarse adjuster 12 and fine adjuster 14 may be configured so that the maximum delay amount in the fine adjuster 14 corresponds to the delay amount for a single delay circuit 120. This widely obtains a dynamic range of the delay amount the phase adjustment circuit 1 as a whole, and finely adjusts the delay amount for a single delay circuit 140 as the minimum change step. The configuration of the phase adjustment circuit 2 is equivalent to configuration of the phase adjustment circuit 1.

Referring back to FIG. 1, the channel coupling circuit 3 receives the output signal of the phase adjustment circuit 1 and the output signal of the phase adjustment circuit 2, detects the phase difference between these two signals, and outputs a signal OUT_FF. That is, the channel coupling circuit 3 detects the phase relationship between the phase adjusted SDATA and CK. The channel coupling circuit 3 is reset with a calibration start signal CALIB_EN output from the controller 7.

Figure 4A:
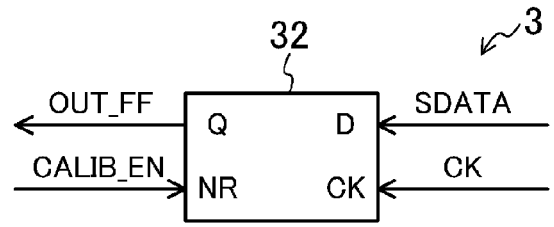
FIGS. 4A-4D illustrate variations of a channel coupling circuit.

FIGS. 4A-4D illustrate variations of the channel coupling circuit 3. For example, as shown in FIG. 4A, the channel coupling circuit 3 may be a single flip-flop 32. The flip-flop 32 receives SDATA as a data signal, and CK as a clock signal, and outputs OUT_FF. The flip-flop 32 also receives CALIB_EN as a reset signal.

Figure 4B:
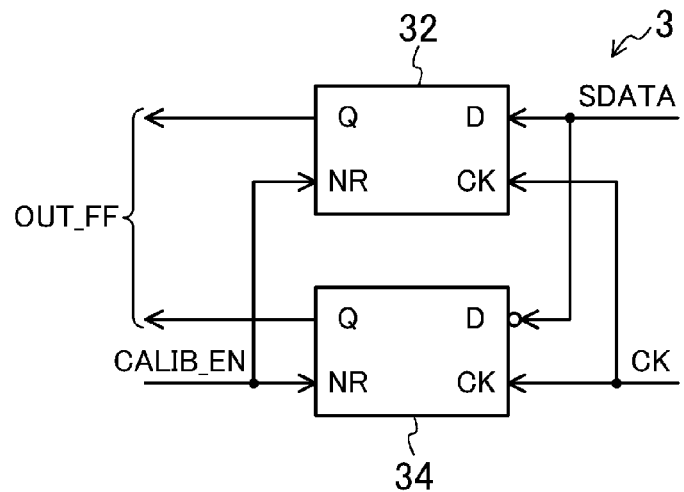

In FIG. 4A, only the phase difference between the rising edge of SDATA and the rising edge of CK. Thus, as shown in FIG. 4B, a flip-flop 34 may be added, which receives an inverted signal of SDATA as a data signal, CK as a clock signal, and CALIB_EN as a reset signal. In FIG. 4B, OUT_FF is consist of the signals output from the flip-flops 32 and 34. This configuration also detects the phase difference between the falling edge of SDATA and the rising edge of CK.

Figure 4C:
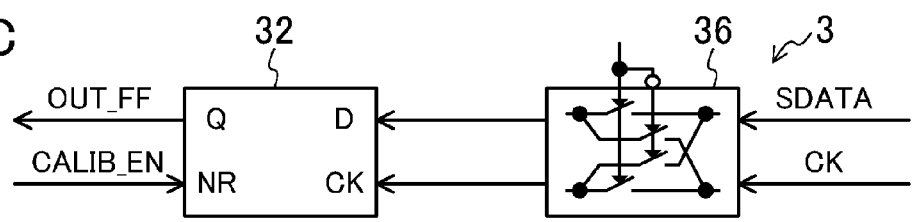
Figure 4D:
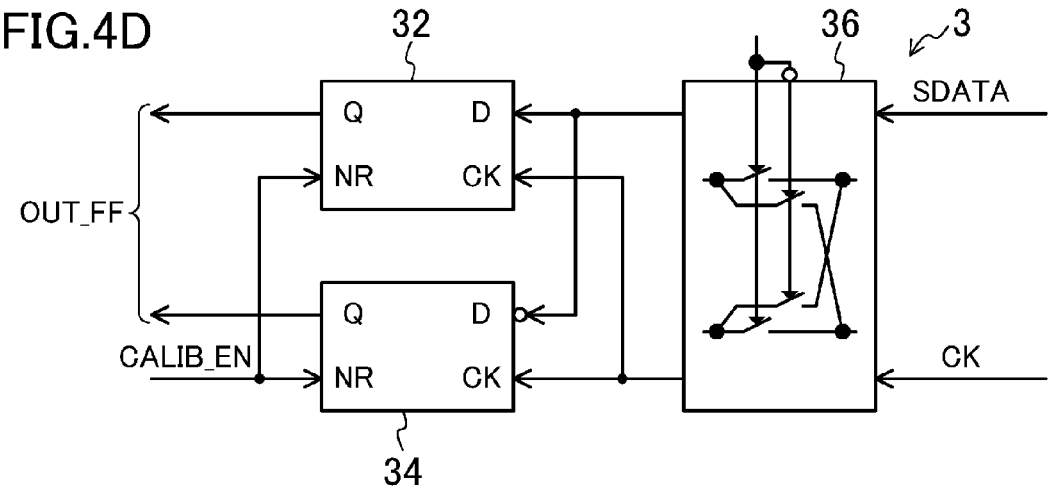

In the flip-flops 32 and 34, the data input and the clock input need to be interchanged in view of a difference between a set up time and a hold time. Thus, as shown in FIG. 4C, a crossbar switch 36 is added to the configuration of FIG. 4A to interchange the data input and the clock input of the flip-flop 32. Alternatively, as shown in FIG. 4D, a crossbar switch 36 is added to the configuration of FIG. 4B to interchange the data inputs and the clock inputs of the flip-flops 32 and 34.

Referring back to FIG. 1, the PVT variation detection circuit 5 detects PVT variations of the phase adjustment circuits 1 and 2, and outputs PVT information indicating the PVT variations. The PVT information may be represented by a digital code PVT_code with a predetermined bit width.

Figure 5A:
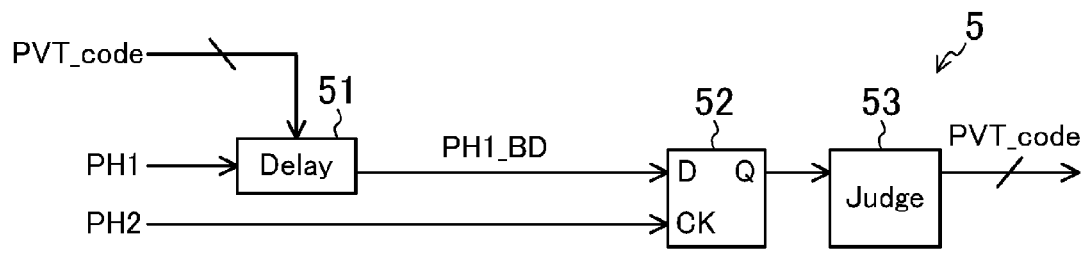
FIGS. 5A-5C illustrate variations of a PVT variation detection circuit.
Figure 5B:
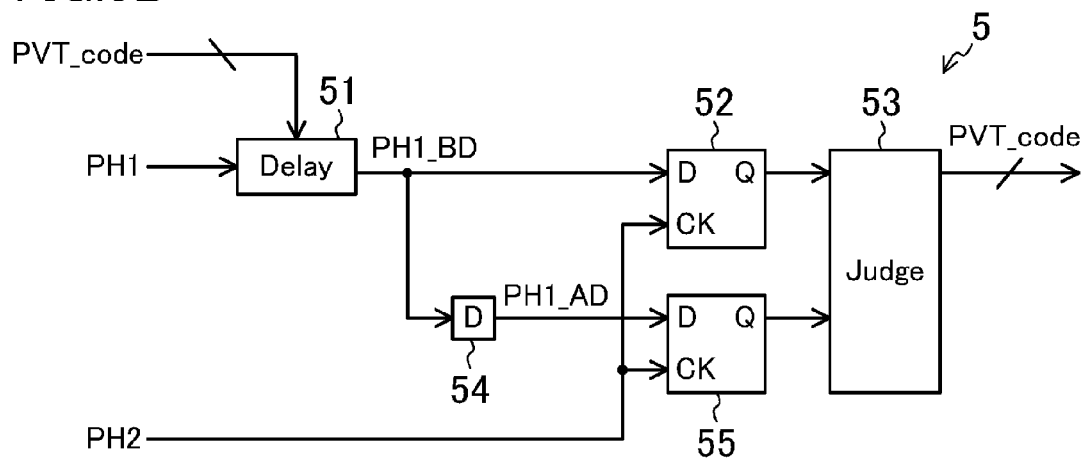
Figure 5C:
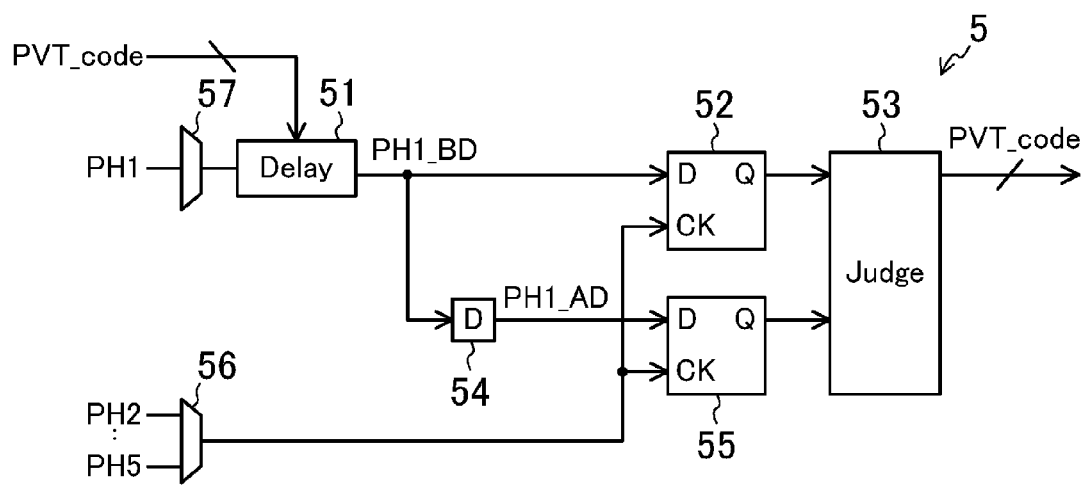

FIGS. 5A-5C illustrate variations of the PVT variation detection circuit 5. For example, as shown in FIG. 5A, the PVT variation detection circuit 5 may include a delay circuit 51, a flip-flop 52, and a determiner 53. The delay circuit 51 delays PH1 output from the multiphase clock generation circuit 4 by a delay amount according to the PVT_code, and outputs a delay signal PH1_BD. Although not particularly shown, the delay circuit 51 may include a plurality of cascade-coupled delay elements and a decoder, which decodes the PVT_code and controls the delay elements. The flip-flop 52 receives PH1_BD as a data signal, and PH2 output from the multiphase clock generation circuit 4 as a clock signal. The determiner 53 changes the PVT_code from the initial value and sweeps the edge of PH1, and holds the PVT_code at the time when the edge reaches the edge of PH2. Specifically, the determiner 53 changes the PVT_code from the initial value, searches the PVT_code at a change in the output of the flip-flop 52, and holds the found PVT_code. The value indicated by the held PVT_code is small when the process is an SS condition of a slow n-channel, and a slow p-channel, and great when the process is an FF condition of a fast n-channel and a fast p-channel. That is, the PVT_code reflects process information.

Figure 6:
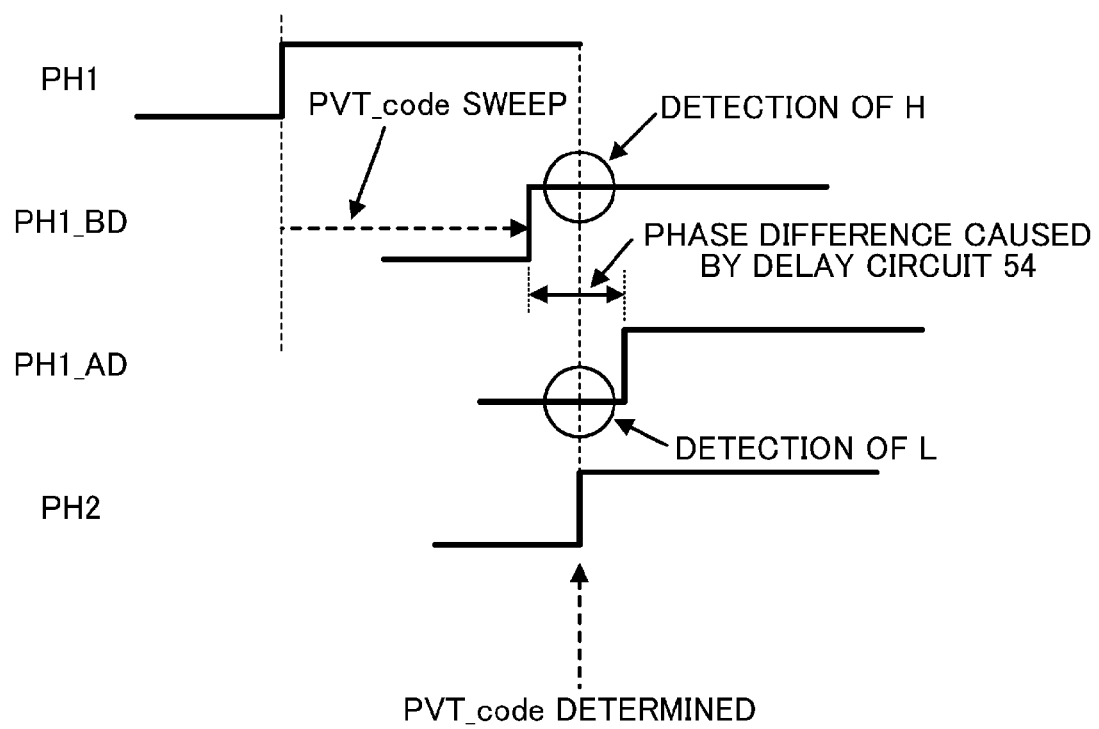
FIG. 6 illustrates the principle of searching PVT information.

In FIG. 5A, if noise is superimposed to PH1_BD, the change point of the output of the flip-flop 52 may be erroneously detected. Thus, as shown in FIG. 5B, a delay circuit 54, which delays PH1_BD and outputs a delayed signal PH1_AD, and a flip-flop 55, which receives PH1_AD as a data signal and PH2 as a clock signal, may be added. A delay circuit 120 forming the coarse adjuster 12 of each of the phase adjustment circuits 1 and 2 may be preferably used as the delay circuit 54. As shown in FIG. 6, the determiner 53 changes the PVT_code from the initial value, searches the PVT_code at the time when the outputs of the flip-flops 52 and 55 are not identical, and holds the found PVT_code.

If the phase difference between PH1 and PH2 is too small, the PVT_code is difficult to find. Thus, instead of PH2, a clock signal whose phase is delayed more than PH2 may be used. For example, as shown in FIG. 5C, a selector 56, which selects any one of PH2, PH3, PH4, and PH5 output from the multiphase clock generation circuit 4, is added to input the output of the selector 56 as a clock signal of the flip-flops 52 and 55. However, since the selector 56 causes signal delay, a dummy selector 57 having the same internal delay amount as the selector 56 is preferably provided at a preceding stage of the delay circuit 51 to delay PH1 by the same amount as the signal passing through the selector 56. The dummy selector 57 may be provided at a subsequent stage of the delay circuit 51 to delay PH1_BD.

In the PVT variation detection circuit 5 having the configurations shown in FIGS. 5A-5C, the sweep of the edge of PH1 falls within the range from the minimum phase difference (where PH1 and PH2 are used) of the multiphase clock generated by the multiphase clock generation circuit 4 to multiples thereof (where PH1 and PH5 are used), thereby relatively shortening the maximum sweep time. This reduces the number of the delay elements forming the delay circuit 51, and the bit width of the PVT_code, thereby detecting the PVT variations in a low circuit area.

Referring back to FIG. 1, the controller 7 outputs control values CONT_D and CONT_CK indicating the desired delay amounts to the phase adjustment circuits 1 and 2, respectively. The delay amounts in the phase adjustment circuits 1 and 2 are determined by the integral multiple of a minimum change step (e.g., 10 ps), CONT_D and CONT_CK are, for example, integral values ranging from 0 to 63 indicating the multipliers thereof.

Due to the PVT variations, the absolute amount of the minimum change step varies. Thus, the PVT variation compensation circuit 6 compensates CONT_D and CONT_CK based on the PVT_code output from the PVT variation detection circuit 5, and controls the delay amounts in the phase adjustment circuits 1 and 2.

Specifically, the PVT variation compensation circuit 6 controls the phase adjustment circuits 1 and 2 using control values obtained by multiplying CONT_D and CONT_CK by PVT_code, respectively. Assume that an absolute delay amount is to be obtained. The control values are small when the process is the SS condition of slow n-channel and a slow p-channel, and great when the process is the FF condition of a fast n-channel and a fast p-channel. That is, the control values compensated by the PVT variation compensation circuit 6 reflect process information.

Figure 7:
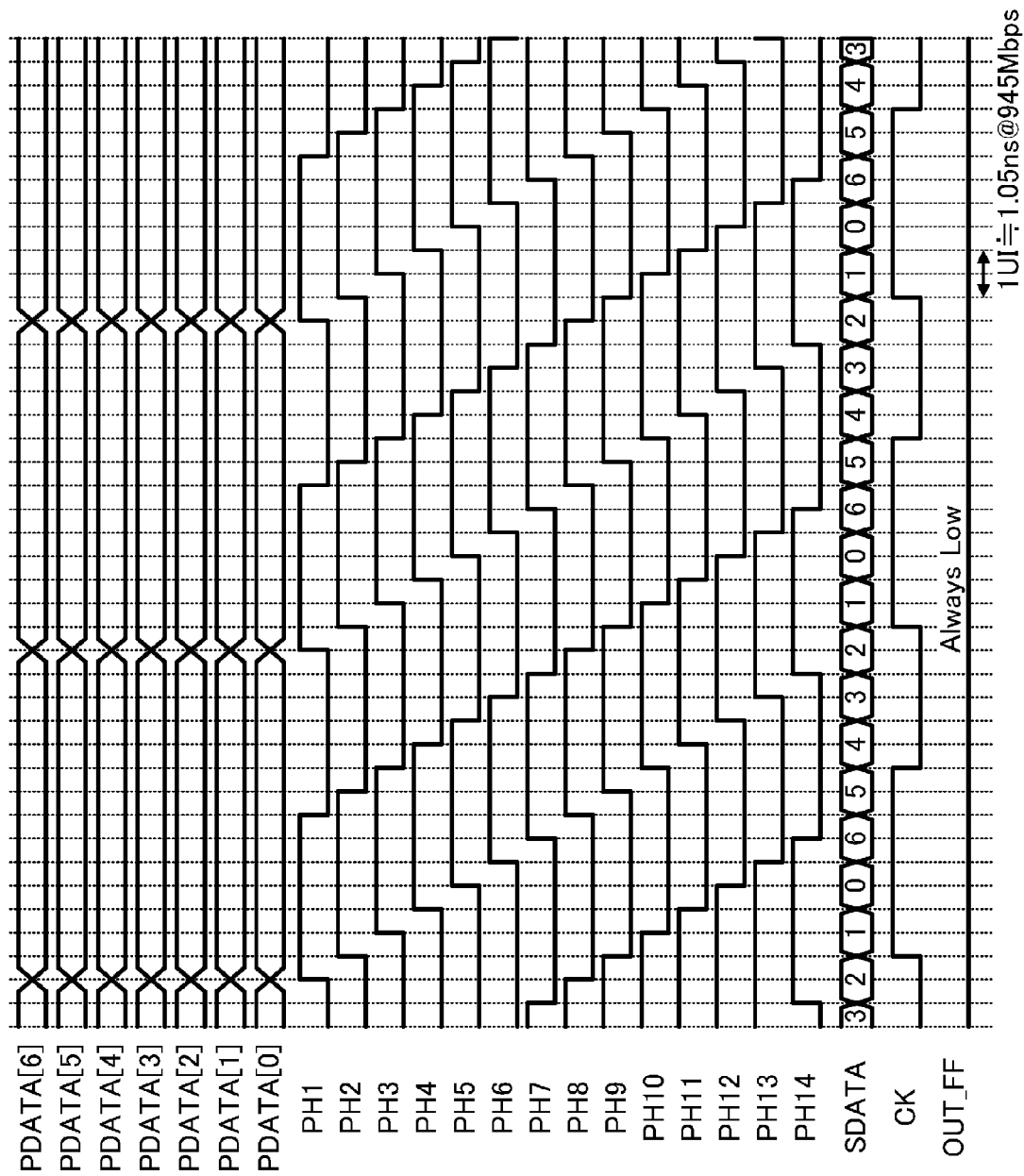
FIG. 7 is a timing chart of various signals in a normal operation mode.

Next, operation of the interchannel skew adjustment circuit according to this embodiment will be described below. FIG. 7 is a timing chart of various signals in a normal operation mode. PDATA[6:0] represents parallel data signals, and each random data of 135

Mbps is input to the parallel-to-serial conversion circuit 102. PH1-PH14 represent 14-phase clock signals generated by the multiphase clock generation circuit 4. Each clock signal has a frequency of 135 MHz. The rising edges are shifted at intervals of 1/14 period, i.e., 525 ps. Out of the signals, PH2, PH4, PH6, PH8, PH10, PH12 and PH14 latch the bit signals of PDATA[6:0] and convert the signals to SDATA. The numerals in the signal waveform indicating SDATA represent the corresponding bit positions in PDATA. The edges of 7 clock signals are spaced apart from each other by 1.05 ns, which corresponds to the minimum time width (i.e., unit interval (UI)) of serial data of 945 Mbps. The SDATA data is converted to the differential output data TD/NTD and output to an external cable and a board wiring.

The clock generation circuit 202 generates the clock signal CK, which rises at the rising edge of PH2, and falls at the rising edge of PH10. In the normal operation mode, the channel coupling circuit 3 is controlled to stop, and thus OUT_FF is always at an L level.

Figure 8:
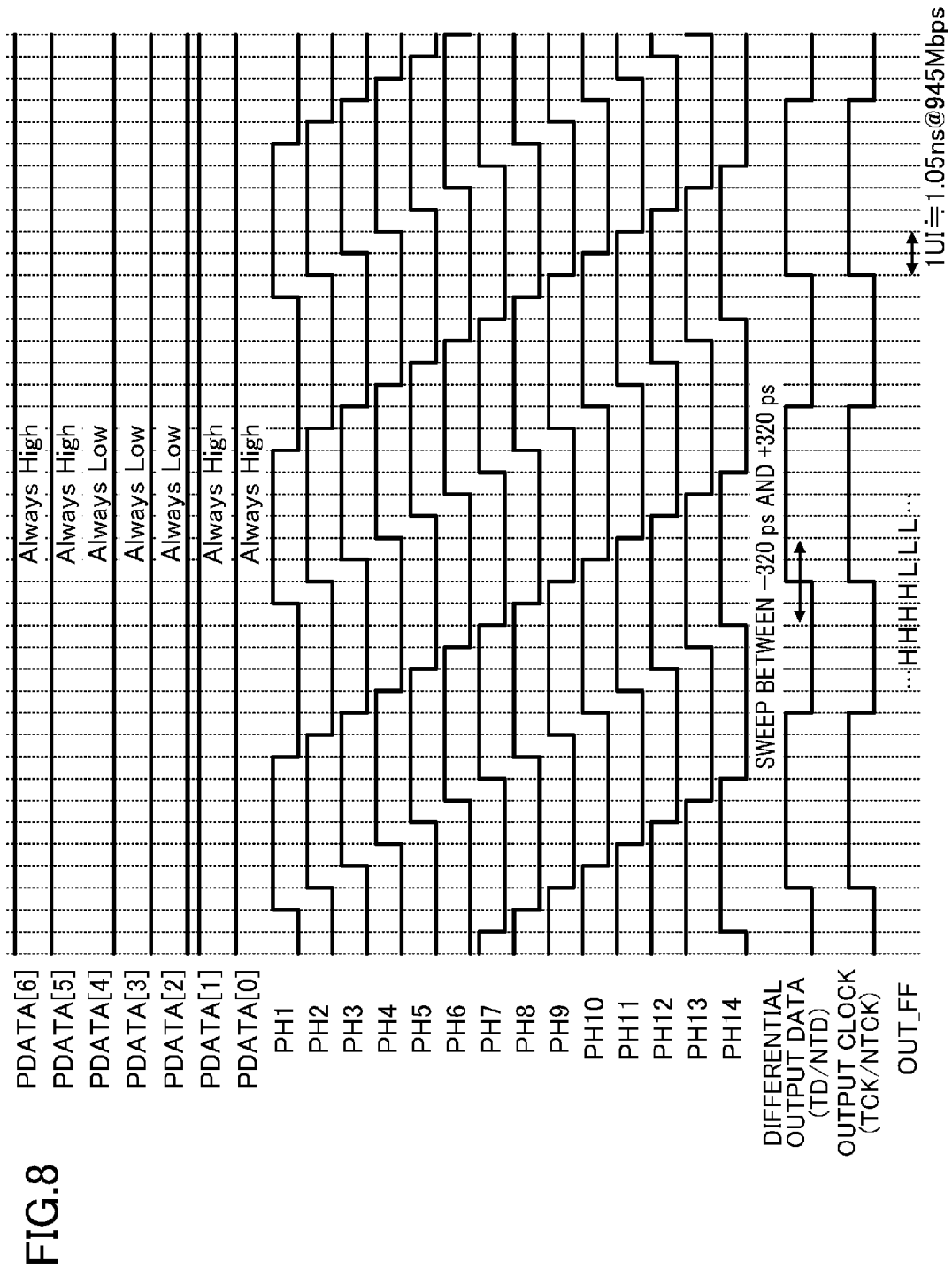
FIG. 8 is a timing chart of various signals in a calibration mode.
Figure 9:
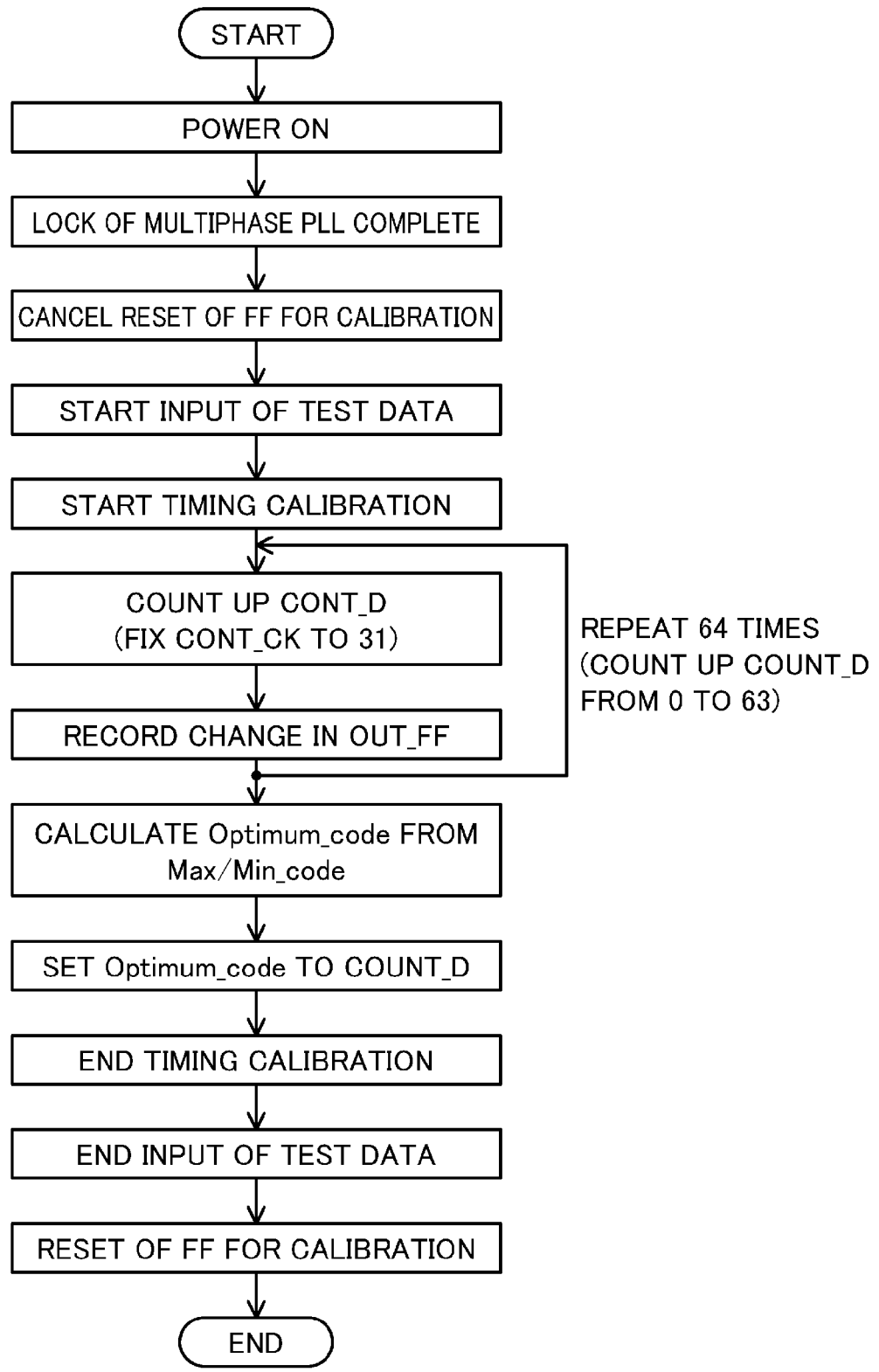
FIG. 9 is a flow chart illustrating operation in the calibration mode.

On the other hand, FIG. 8 is a timing chart of various signals in a calibration mode. FIG. 9 is an operation flow in the calibration mode. After the sender is powered on, and the lock of the multiphase clock generation circuit 4 is complete, the calibration mode starts. First, CALIB_EN is activated to cancel reset of the channel coupling circuit 3, and input of test data starts. In the calibration mode, a fixed signal is input as test data of PDATA[6:0]. For facilitation of a test, the fixed data for generating data signals, which have the same frequency and pattern as CK, are input. Prior to the start of the calibration mode, the PVT variation detection circuit 5 obtains the PVT information.

Then, CONT_D is counted up from 0 to 63 to record a change in OUT_FF when the delay amount in the phase adjustment circuit 1 increases by 10 ps. At this time, CONT_CK is fixed to 31, which is the median. This is because the phase difference between SDATA and CK is swept from −320 ps to +320 ps to search an optimum control value for optimizing the delay amount in the phase adjustment circuit 1.

Figure 10:
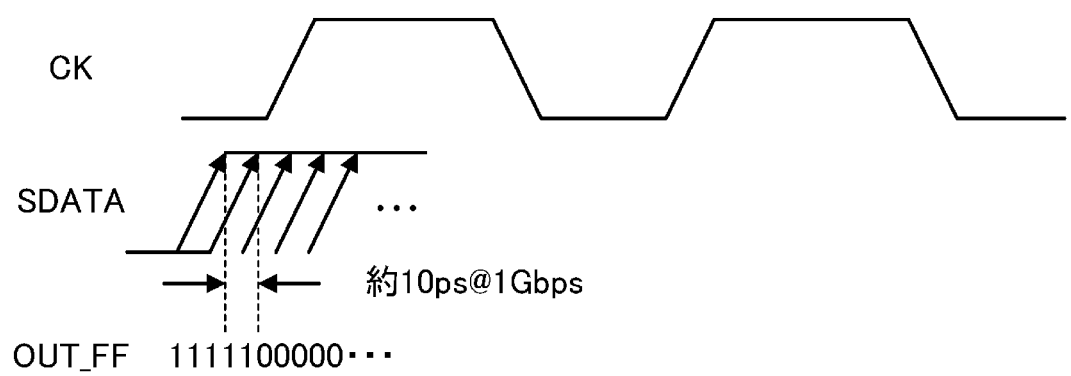
FIG. 10 is a schematic diagram illustrating that an edge of a signal of a channel is swept to search an optimum control value.

FIG. 10 schematically illustrates that the edge of SDATA is swept to search an optimum control value. Where the channel coupling circuit 3 has the configuration shown in FIG. 2A, the optimum control value is CONT_D at the time when OUT_FF changes from 1 to 0. Where the channel coupling circuit 3 has the configuration shown in FIG. 2B, the optimum control value is the average between CONT_D at the time when the output of the flip-flop 32 changes from 1 to 0, and CONT_D at the time when the output of the flip-flop 34 changes from 1 to 0. Where the channel coupling circuit 3 has the configuration shown in FIG. 2C, the optimum control value is the average between CONT_D at the time when the crossbar switch 36 is coupled straight to change OUT_FF from 1 to 0, and CONT_D at the time when the crossbar switch 36 is cross-coupled to change OUT_FF from 1 to 0. Where the channel coupling circuit 3 has the configuration shown in FIG. 2D, the optimum control value is the average among CONT_D at the time when the crossbar switch 36 is coupled straight to change the output of the flip-flop 32 from 1 to 0, CONT_D at the time when the output of the flip-flop 34 changes from 1 to 0, CONT_D at the time when the crossbar switch 36 is cross-coupled to change the output of the flip-flop 32 from 1 to 0, and CONT_D at the time when the output of the flip-flop 34 changes from 1 to 0.

Figure 11A:
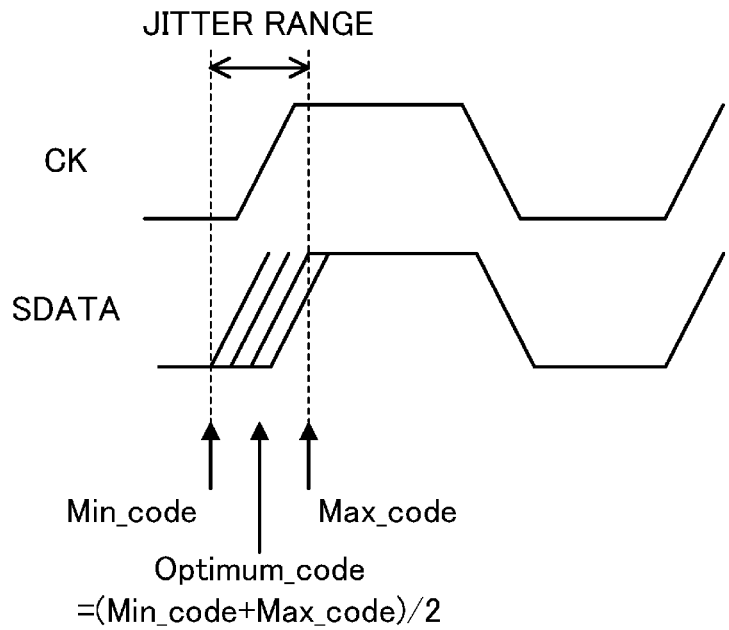
FIGS. 11A and 11B illustrate calculation of the optimum control value in view of a jitter.
Figure 11B:
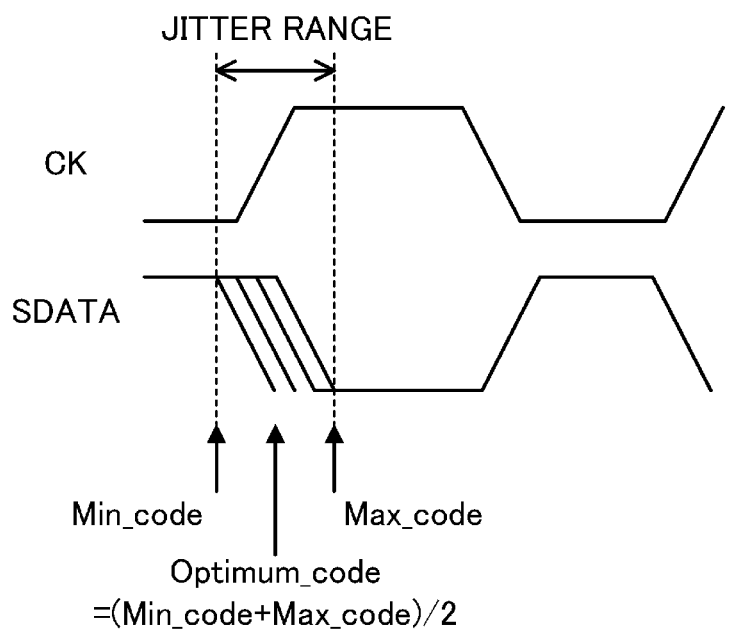

Taking into consideration that CK and SDATA contain a jitter, the above-described search is preferably repeated a plurality of times. For example, assume that skew between the rising edge of CK and the rising edge of SDATA is adjusted. As shown in FIG. 11A, the maximum value and the minimum value of CONT_D when the rising edge of SDATA overlaps the rising edge of CK are Max_code and Min_code, respectively. The optimum control value Optimum_code is the average between the maximum value and the minimum value. For example, similarly, assume that skew between the rising edge of CK and the falling edge of SDATA is adjusted. As shown in FIG. 11B, the maximum value and the minimum value of CONT_D when the falling edge of SDATA overlaps the rising edge of CK are Max_code and Min_code, respectively. The optimum control value Optimum_code is the average between the maximum value and the minimum value.

The Optimum_code calculated in this manner is set to the controller 7 as the control value CONT_D optimizing the delay amount in the phase adjustment circuit 1. After that, the input of the test data ends to deactivate CALIB_EN, thereby resetting the channel coupling circuit 3 and ending the calibration mode.

The calibration is performed not only once when the sender is powered on, but also may be continuously performed after the power-on. For example, in a television device etc., if the calibration is performed in a blanking period, continuous calibration is possible without causing fuzziness in a normal output image.

The interchannel skew adjustment circuit according to this embodiment is variable as follows. Instead of SDATA and CK, TD/NTD and TCK/NTCK may be input to the channel coupling circuit 3. Since the phase difference between CK and SDATA can be adjusted by the phase adjustment circuit 1 only, the phase adjustment circuit 2 may be omitted. Where the PVT variations in the phase adjustment circuits 1 and 2 are not problematic, the PVT variation detector 5 and the PVT variations compensator 6 may be omitted.

The number of the channels subjected to the skew adjustment may be three or more. For example, 4 ports of the combination of one channel of a clock transmitter and 5 channels of data transmitters is used in an LVDS interface. In this case, a channel coupling circuit may be provided between the clock transmitter and each data transmitter to adjust skew between the signal of the clock transmitter and the signal of each data transmitter. Skew between data transmitters, or between clock transmitters may be adjusted.

Figure 12:
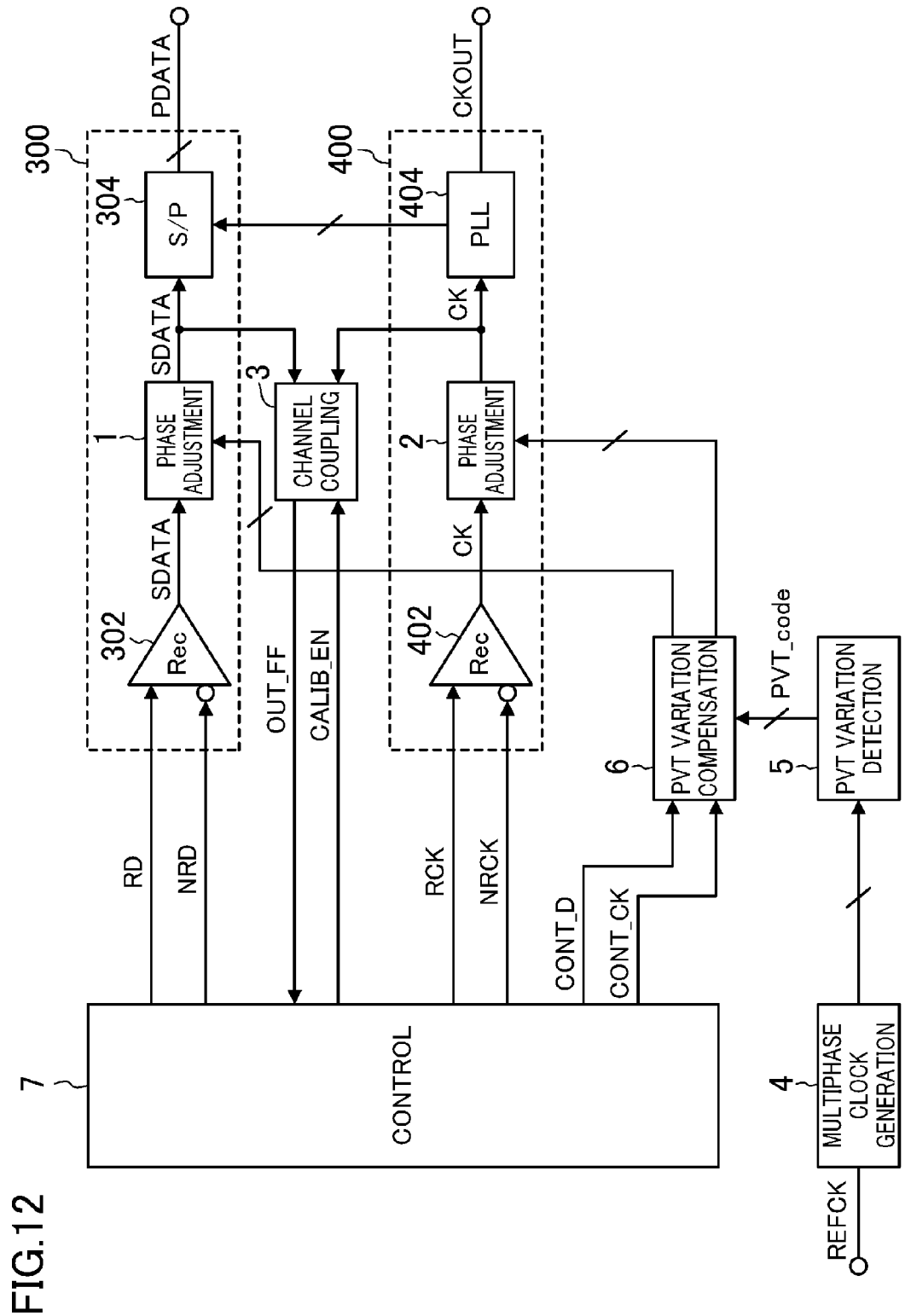
FIG. 12 illustrates the configuration of a receiver mounting an interchannel skew adjustment circuit according to an embodiment of the present disclosure.

As shown in FIG. 12, the interchannel skew adjustment circuit according to this embodiment may be mounted in a receiver. Specifically, the receiver includes the interchannel skew adjustment circuit according to this embodiment, a data receiver 300 (i.e., a first channel) receiving an LVDS data signal containing a signal RD and its inverted signal NRD, and generating a parallel data signal PDATA, and a clock receiver 400 (i.e., a second channel) receiving a differential clock signal containing a signal RCK and its inverted signal NRCK, and generating a clock signal CKOUT. The clock receiver 400 includes a differential amplifier 402 generating a clock signal CK from the differential clock signal, and a PLL circuit 404 generating multiphase clocks and CKOUT from the CK delayed by the phase adjustment circuit 2. The data receiver 300 includes a differential amplifier 302 generating a serial data signal SDATA from the LVDS data signal, and a serial-to-parallel conversion circuit 304 converting the SDATA delayed by the phase adjustment circuit 1 to the PDATA using the multiphase clock output from the PLL circuit 404.

Application

Figure 13:
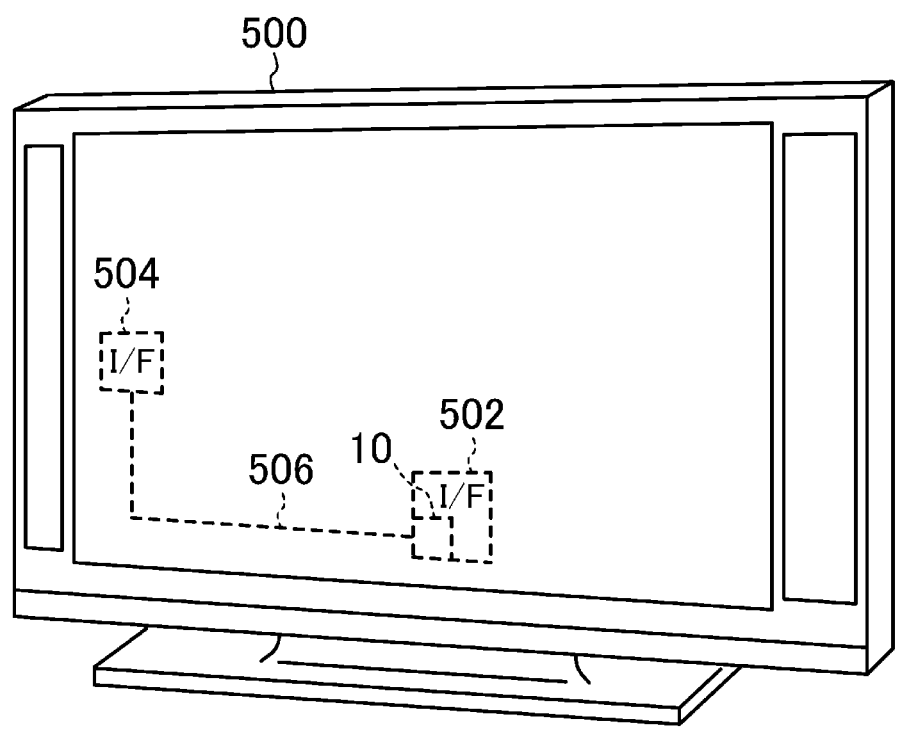
FIG. 13 illustrates an overview of a television device according to an example application.

FIG. 13 illustrates an overview of a television device according to an application example. This television device includes interfaces 502 and 504 for sending and receiving various signals. These interfaces are coupled by an LVDS cable 506. One of the interfaces 502 and 504 is a sender, and the other is a receiver. The interface 502 includes the interchannel skew adjustment circuit 10 according to this embodiment. As such, the interchannel skew adjustment circuit according to this embodiment is suitable for a signal transmission interface in a television device.

The interchannel skew adjustment circuit according to this embodiment is also suitable for in-vehicle application. In addition, the interchannel skew adjustment circuit according to this embodiment is applicable where skew between/among two or more clock signals is to be adjusted in signal transmission (e.g., clock transmission) inside a semiconductor chip.

What is claimed is:

1. An interchannel skew adjustment circuit comprising:
   a phase adjustment circuit configured to receive a signal of a first channel, delay the signal by a discretely variable delay amount, and output a delayed signal;
   a channel coupling circuit configured to receive the signal output from the phase adjustment circuit and a signal of a second channel, and detect a phase difference between these two signals;
   a controller configured to control the delay amount in the phase adjustment circuit based on a result detected by the channel coupling circuit;
   a PVT variation detection circuit configured to detect PVT variations of the phase adjustment circuit, and output PVT information indicating the PVT variations; and
   a PVT variation compensation circuit configured to compensate a control value output from the controller to the phase adjustment circuit based on the PVT information to control the delay amount in the phase adjustment circuit, wherein
   the PVT variation detection circuit includes
      a delay circuit configured to receive a first signal, delay the first signal by a variable delay amount, and output a first delay signal,
      a flip-flop configured to receive the first delay signal as a data signal, and a second signal whose phase is shifted from a phase of the first signal by a predetermined amount as a clock signal, and
      a determiner configured to determine the PVT information based on an output of the flip-flop, and
   the delay amount of the delay circuit is controlled with the PVT information determined by the determiner.

2. The interchannel skew adjustment circuit of claim 1, wherein
   the PVT variation detection circuit includes
      another delay circuit configured to delay the first delay signal, and output a second delay signal, and
      another flip-flop configured to receive the second delay signal as a data signal, and the second signal as a clock signal, and
   the determiner determines the PVT information based on outputs of the two flip-flops.

3. The interchannel skew adjustment circuit of claim 2, wherein
   the PVT variation detection circuit includes
      a selector configured to select, as the second signal, any one of a plurality of input signals, and
      a dummy selector having a same internal delay amount as the selector, and configured to delay and output the input first signal.

4. The interchannel skew adjustment circuit of claim 1, wherein
the channel coupling circuit includes a flip-flop configured to receive one of the two signals as a data signal, and the other as a clock signal.

5. The interchannel skew adjustment circuit of claim 4, wherein
the channel coupling circuit includes a flip-flop configured to receive an inverted signal of the data signal and the clock signal as a data signal and a clock signal, respectively.

6. The interchannel skew adjustment circuit of claim 4, wherein
the channel coupling circuit includes a crossbar switch configured to alternately interchange the data signal and the clock signal, and input the signals to the flip-flop.

7. The interchannel skew adjustment circuit of claim 1, wherein
the phase adjustment circuit includes an inverter chain of a plurality of cascade-coupled inverter circuits.

8. The interchannel skew adjustment circuit of claim 1, wherein
the phase adjustment circuit includes
a coarse adjuster configured to change the delay amount in big steps, and
a fine adjuster configured to change the delay amount in small steps, and delay an output signal of the coarse adjuster.

9. The interchannel skew adjustment circuit of claim 8, wherein
the fine adjuster includes a delay circuit configured to switch between activation and deactivation of any one of a plurality of inverter circuits coupled in parallel.

10. The interchannel skew adjustment circuit of claim 8, wherein
the fine adjuster includes a phase interpolator circuit.

11. An electronic device comprising the interchannel skew adjustment circuit of claim 1.

12. An interchannel skew adjustment circuit comprising:
a phase adjustment circuit configured to receive a signal of a first channel, delay the signal by a discretely variable delay amount, and output a delayed signal;
a channel coupling circuit configured to receive the signal output from the phase adjustment circuit and a signal of a second channel, and detect a phase difference between these two signals;
a controller configured to control the delay amount in the phase adjustment circuit based on a result detected by the channel coupling circuit;
a PVT variation detection circuit configured to detect PVT variations of the phase adjustment circuit, and output PVT information indicating the PVT variations;
a PVT variation compensation circuit configured to compensate a control value output from the controller to the phase adjustment circuit based on the PVT information to control the delay amount in the phase adjustment circuit; and
another phase adjustment circuit configured to receive a signal of the second channel, delay the signal by a discretely variable delay amount, and output a delayed signal, wherein
the channel coupling circuit receives a signal output from the another phase adjustment circuit as the signal of the second channel, and
the PVT variation compensation circuit compensates a control value output from the controller to the another phase adjustment circuit based on the PVT information to control the delay amount in the another phase adjustment circuit,
the PVT variation detection circuit includes
a delay circuit configured to receive a first signal, delay the first signal by a variable delay amount, and output a first delay signal,
a flip-flop configured to receive the first delay signal as a data signal, and a second signal whose phase is shifted from a phase of the first signal by a predetermined amount as a clock signal, and
a determiner configured to determine the PVT information based on an output of the flip-flop, and
the delay amount of the delay circuit is controlled with the PVT information determined by the determiner.

13. The interchannel skew adjustment circuit of claim 12, wherein
the PVT variation detection circuit includes
another delay circuit configured to delay the first delay signal, and output a second delay signal, and
another flip-flop configured to receive the second delay signal as a data signal, and the second signal as a clock signal, and
the determiner determines the PVT information based on outputs of the two flip-flops.

14. The interchannel skew adjustment circuit of claim 13, wherein
the PVT variation detection circuit includes
a selector configured to select, as the second signal, any one of a plurality of input signals, and
a dummy selector having a same internal delay amount as the selector, and configured to delay and output the input first signal.

* * * * *